US007475371B2

(12) United States Patent
Jacobi et al.

(10) Patent No.: US 7,475,371 B2
(45) Date of Patent: *Jan. 6, 2009

(54) METHOD AND SYSTEM FOR CASE-SPLITTING ON NODES IN A SYMBOLIC SIMULATION FRAMEWORK

(75) Inventors: Christian Jacobi, Boeblingen (DE); Geert Janssen, Putnam Valley, NY (US); Viresh Paruthi, Austin, TX (US); Kai Oliver Weber, Boeblingen (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/963,290

(22) Filed: Dec. 21, 2007

(65) Prior Publication Data

US 2008/0092098 A1 Apr. 17, 2008

Related U.S. Application Data

(63) Continuation of application No. 11/225,651, filed on Sep. 13, 2005, now Pat. No. 7,363,603.

(51) Int. Cl.
*G06F 9/45* (2006.01)
*G06F 17/50* (2006.01)
(52) U.S. Cl. ............ 716/5; 716/4; 716/7; 703/14
(58) Field of Classification Search .......... 716/4, 716/5, 7; 703/14
See application file for complete search history.

(56) References Cited

U.S. PATENT DOCUMENTS 5,502,661 A    3/1996   Glunz
5,623,418 A    4/1997   Rostoker et al.
5,910,897 A    6/1999   Dangelo et al.
5,946,472 A    8/1999   Graves et al.
6,052,524 A    4/2000   Pauna
6,088,821 A    7/2000   Moriguchi et al.
6,301,687 B1   10/2001  Jain et al.
6,327,687 B1   12/2001  Rajski et al.

(Continued)

OTHER PUBLICATIONS

Peranandam, et al., Transactional Level Verification and Coverage Metrics by Means of Symbolic Simulation.

*Primary Examiner*—Thuan Do
*Assistant Examiner*—Nha T Nguyen
(74) *Attorney, Agent, or Firm*—Casimer K. Salys; Dillon & Yudell LLP

(57) ABSTRACT

A method for performing verification includes receiving a design and building for the design an intermediate binary decision diagram set containing one or more nodes representing one or more variables. A first case-splitting is performed upon a first fattest variable from among the one or more variables represented by the one or more nodes by setting the first fattest variable to a primary value, and a first cofactoring is performed upon the intermediate binary decision diagram set with respect to the one or more nodes using an inverse of the primary value to generate a first cofactored binary decision diagram set. A second cofactoring is performed upon the intermediate binary decision diagram set with respect to the one or more nodes using the primary value to generate a second cofactored binary decision diagram set, and verification of the design is performed by evaluating a property of the second cofactored binary decision diagram set.

7 Claims, 3 Drawing Sheets

U.S. PATENT DOCUMENTS

| | | |
|---|---|---|
| 6,353,806 B1 | 3/2002 | Gehlot |
| 6,359,345 B1 | 3/2002 | Suzuki |
| 6,539,345 B1 | 3/2003 | Jones et al. |
| 6,634,012 B2 | 10/2003 | Zhong et al. |
| 6,651,096 B1 | 11/2003 | Gai et al. |
| 6,745,160 B1 | 6/2004 | Ashar et al. |
| 6,842,750 B2 | 1/2005 | Andreev et al. |
| 2002/0178432 A1 | 11/2002 | Kim et al. |
| 2005/0091025 A1* | 4/2005 | Wilson et al. ............ 703/16 |

* cited by examiner

METHOD AND SYSTEM FOR CASE-SPLITTING ON NODES IN A SYMBOLIC SIMULATION FRAMEWORK

PRIORITY CLAIM

The present application is a continuation of U.S. patent application Ser. No. 11/225,651, filed on Sep. 13, 2005 now U.S. Pat. No. 7,363,603, and entitled, "Method and System for Case-Splitting on Nodes in a Symbolic Simulation Framework," which is incorporated herein by reference.

BACKGROUND OF THE INVENTION

1. Field of the Invention

The present invention relates in general to verifying designs and in particular to verifying a logic function using a decision diagram. Still more particularly, the present invention relates to a system, method and computer program product for case-splitting on nodes in a symbolic simulation framework.

2. Description of the Related Art

Formal and semiformal verification techniques provide powerful tools for discovering errors in verifying the correctness of logic designs. Formal and semiformal verification techniques frequently expose probabilistically uncommon scenarios that may result in a functional design failure. Frequently, formal and semiformal verification techniques provide the opportunity to prove that a design is correct (i.e., that no failing scenario exists).

One commonly-used approach to formal and semiformal analysis for applications operating on representations of circuit structures is to represent the underlying logical problem structurally (as a circuit graph), and then use Binary Decision Diagrams (BDDs) to convert the structural representation into a functionally canonical form.

In such an approach, in which a logical problem is represented structurally and binary decision diagrams are used to convert the structural representation into a functionally canonical form, a set of nodes for which binary decision diagrams are required to be built, called "sink" nodes, are identified. Examples of sink nodes include the output node or nodes in an equivalence checking or a false-paths analysis context. Examples of sink nodes also include targets in a property-checking or model-checking context.

Unfortunately, formal verification techniques require computational resources which are exponential with respect to the size of the design under test. In particular, many formal analysis techniques require exponential resources with respect to the number of state elements in the design under test. Semiformal verification techniques leverage formal algorithms on larger designs by applying them only in a resource-bounded manner, though at the expense of incomplete verification coverage; generally, coverage decreases as design size increases.

Symbolic simulation is a symbolic exploration approach that has been used to exhaustively check designs for a bounded number of steps, starting at the initial states. This method verifies a set of scalar tests with a single symbolic vector. Symbolic inputs (represented as BDDs) are assigned to the inputs and propagated through the circuit to the outputs. This technique has the advantage that large input spaces are covered in parallel with a single symbolic sweep of the circuit. Symbolic simulation is resource intensive, however, due to the explosion of BDD representations.

SUMMARY OF THE INVENTION

A method for performing verification includes receiving a design and building for the design an intermediate binary decision diagram set containing one or more nodes representing one or more variables. A first case-splitting is performed upon a first fattest variable from among the one or more variables represented by the one or more nodes by setting the first fattest variable to a primary value, and a first cofactoring is performed upon the intermediate binary decision diagram set with respect to the one or more nodes using an inverse of the primary value to generate a first cofactored binary decision diagram set. A second cofactoring is performed upon the intermediate binary decision diagram set with respect to the one or more nodes using the primary value to generate a second cofactored binary decision diagram set, and verification of the design is performed by evaluating a property of the second cofactored binary decision diagram set.

BRIEF DESCRIPTION OF THE DRAWINGS

The present invention is described in a preferred embodiment in the following description with reference to the drawings, in which like numbers represent the same or similar elements, as follows.

DETAILED DESCRIPTION OF A PREFERRED EMBODIMENT

The present invention provides a method, system, and computer program product to optimize case-splitting and ameliorate the explosion in BDD representations when simulating a design symbolically. The method of the present invention helps to ensure that the sizes of intermediate BDDs do not exceed a specified size limit, ultimately improving the likelihood that the symbolic simulation completes on a design for which it otherwise may not have previously completed under the prior art due to the exhaustion of resources (e.g., available memory on the machine). The method of the present invention employs a strategy and heuristic for automated case-splitting, and the overall case-splitting approach improves the likelihood of completeness (e.g., the analysis of all cases, as if no case-splitting had been performed). The method of the present invention enables significant performance improvements over that possible in the prior art, offering the hope of completing symbolic simulation when prior-art solutions may not have completed due to BDD explosion.

The present invention is generally applicable to a sequential design representation, and application of this invention to a combinational design representation follows as a special case of the sequential model.

Figure 1:
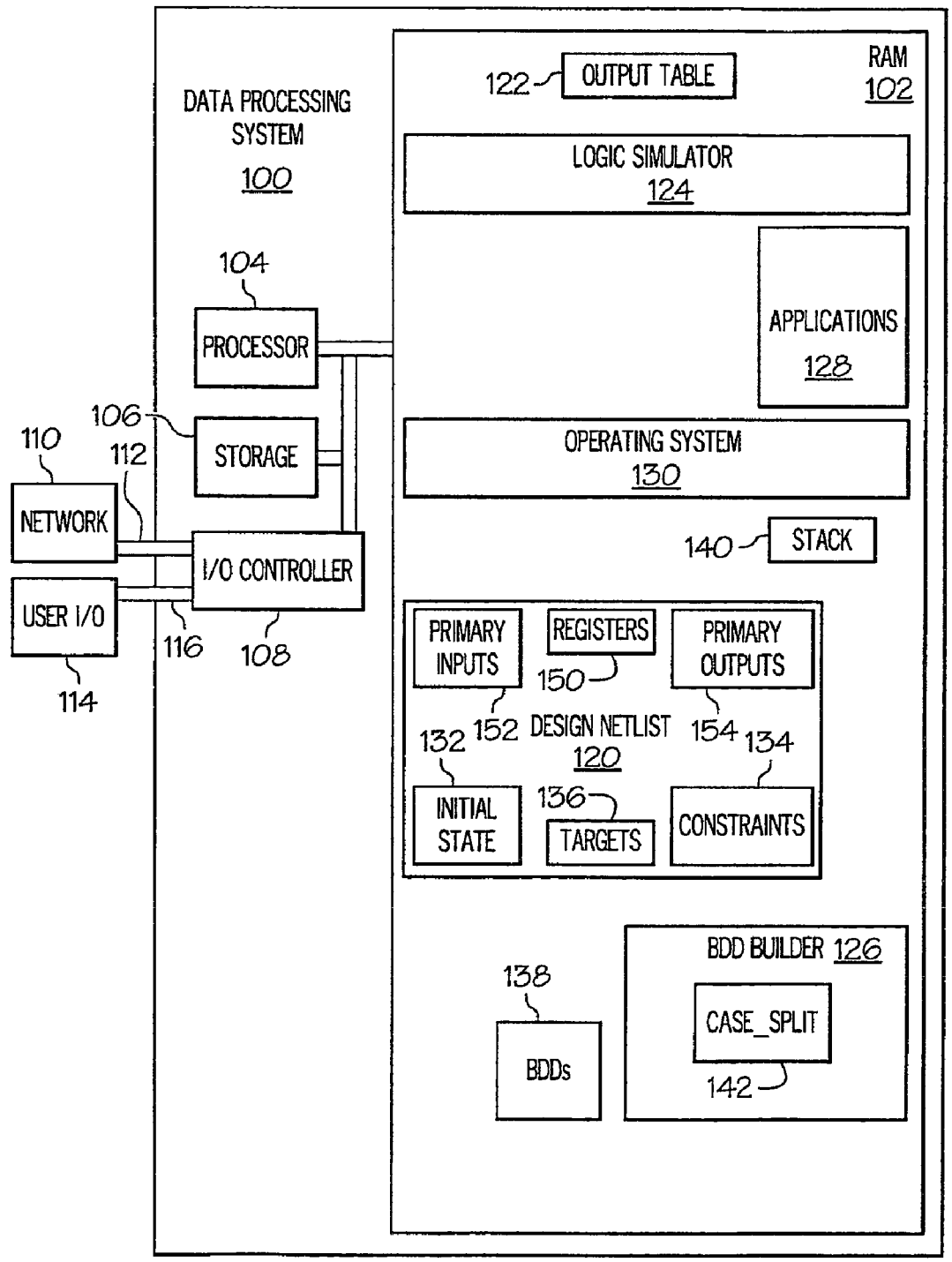
FIG. 1 illustrates a block diagram of a general-purpose data processing system with which the present invention of a method, system and computer program product for case-splitting on nodes in a symbolic simulation framework may be performed.

With reference now to the figures, and in particular with reference to FIG. 1, a block diagram of a general-purpose data processing system, in accordance with a preferred embodiment of the present invention, is depicted. Data processing system 100 contains a processing storage unit (e.g., RAM 102) and a processor 104. Data processing system 100 also includes non-volatile storage 106 such as a hard disk drive or other direct-access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions while operating in accordance with a preferred embodiment of the present invention, including a design netlist 120 and an output table 122 for interaction with a logic simulator 124 and a binary decision diagram builder 126. Other applications 128 and logic simulator 124 interface with processor 104, RAM 102, I/O control 108, and storage 106 through operating system 130. Other data structures in RAM 102 include binary decision diagrams 138 and a stack 140. One skilled in the data processing arts will quickly realize that additional components of data processing system 100 may be added to or substituted for those shown without departing from the scope of the present invention.

A netlist graph, such as design netlist 120, is a popular means of compactly representing circuit structures in computer-aided design of digital circuits. Such a representation is non-canonical and offers limited ability to analyze the function from the nodes in the graph. Design netlist 120 contains a directed graph with vertices representing gates and edges representing interconnections between those gates. The gates have associated functions, such as constraints 134, targets 136, primary inputs 152, primary outputs 154, combinational logic (e.g., AND gates), and sequential elements (hereafter referred to as registers 150). Registers 150 have two associated components; their next-state functions and their initial-value functions, which are represented as other gates in the graph or as an initial state data structure 132. Semantically, for a given register 150, the value appearing at its initial-value gate at time "0"("initialization" or "reset" time) will be applied as the value of the register itself; the value appearing at its next-state function gate at time "i" will be applied to the register itself at time "i+1".

Binary decision diagrams (BDDs) 138 are a popular choice for efficiently applying Boolean reasoning to problems derived from circuit structures, which are frequently represented in netlist graphs, such as design netlist 120. Binary decision diagrams 138 offer a compact and canonical representation of the Boolean function of a graph node, which expedites reasoning regarding a node's function.

Processor 104 executes instructions from programs, often stored in RAM 102, in the course of performing the present invention. In a preferred embodiment of the present invention, processor 104 executes logic simulator 124. Logic simulator 124 creates binary decision diagrams 138 through the operation of binary decision diagram builder 126 on design netlist 120.

Targets 136 represent nodes whose Boolean expressions are of interest and need to be computed. The goal of the verification process is to find a way to drive a '1' on a target node, or to prove that no such assertion of the target is possible. In the former case, a "counterexample trace" showing the sequence of assignments to the inputs in every cycle leading up to the failure event is generated and recorded to output table 122.

Logic simulator 124 includes a computer program product, stored in RAM 102 and executed on processor 104, which provides a series of tools for activities such as equivalence checking, property checking, logic synthesis and false-paths analysis. Generally speaking, logic simulator 124 contains rule-based instructions for predicting the behavior of logically modeled items of hardware.

Logic simulator 124 uses the series of rules contained in its own instructions, in conjunction with design netlist 120, to represent the underlying logical problem structurally (as a circuit graph), and uses binary decision diagram builder 126 to construct binary decision diagrams 138, thereby converting the structural representation into a functionally canonical form. In a preferred embodiment, logic simulator 124 includes a Cycle-Based Symbolic Simulator (CBSS), which performs a cycle-by-cycle simulation on design netlist 120 symbolically by applying unique random, or non-deterministic, variables to the netlist inputs in every cycle. Logic simulator 124 essentially performs forward BDD-based bounded symbolic simulation, starting from initial state 132. Logic simulator 124 extends the cycle simulation methodology to symbolic values. Logic simulator 124 applies symbolic functions to the inputs in every cycle and propagates them to the targets 136.

At each step the Boolean expressions, represented as BDDs 138, corresponding to each node in design netlist 120 are computed until the expressions for all "sink" nodes (i.e., nodes labeled as primary outputs, targets, constraints and next-state functions of registers) are obtained. At each step of the simulation the Boolean expressions of the target nodes are tested for assertion of a value of '1'. If so, a counterexample trace leading up to the failure (represented by the assertion of the target node to a '1') is returned. The constraints need to be factored in before this check for the targets being hit can be done. This factoring is typically accomplished by simply ANDing the Boolean expression for the target with the Boolean expression for each of the constraints.

If unsolved targets 136 remain, then the registers 150 are updated with the values, represented as binary decision diagrams 138, of the next-state functions, and the process continues. At every step of the verification process, there is a potential for a blow-up in memory when computing the binary decision diagrams 138 for any of the sink nodes.

The method of the present invention addresses the risk of memory blow-up when computing intermediate binary decision diagrams 138 in several steps. First, if a size of an intermediate binary decision diagram 138 exceeds a certain threshold, logic simulator 124 selects a variable of the binary decision diagram 138 variable to case-split on, and the value to be applied to the selected variable. Second, upon case-splitting the sizes of binary decision diagram 138 drop significantly, and logic simulator 124 then continues with the symbolic analysis using reduced resources relative to that which was possible without the case-splitting. Third, logic simulator 124 may then repeat the case-split on any number of nodes at different steps and stages of the symbolic simulation. Fourth, once logic simulator 124 completes the symbolic analysis (i.e., the design has been symbolically simulated for the required number of time-steps), logic simulator 124 may backtrack to the last case-split (and the time-step in which it was applied) and set the selected variable to a next constant (i.e., if a single variable was selected for case-splitting, the present invention sets it to the opposite value of what it was set to in the prior analysis), and completes the symbolic analysis.

This reversion step may be continued until all case-splits are covered, ensuring complete coverage of the search space.

Furthermore, the present invention enables logic simulator 124 to perform case-splitting using global resources, in which case the case-splitting gracefully degrades into underapproximate analysis if the global resource limits are exceeded. In underapproximate analysis, the complete search will not be performed by logic simulator 124 after global resources are exceeded, (i.e., the process will not backtrack to try the other value of the case-split node(s)). Nonetheless, very high coverage will be attained by logic simulator 124 using the process of the present invention through the selection of high-quality case splits.

The present invention includes in logic simulator 124 a novel heuristic to select the variable(s) to case-split upon, which is very effective in managing space complexity of binary decision diagram 138 operations and efficiently yielding high coverage. Logic simulator 124 performs a case-split upon the "fattest" binary decision diagram 138 variable. The fattest variable is defined herein as being one that has the maximum number of nodes in all currently alive (i.e., unsolved) binary decision diagrams 138. Setting the "fattest" variable to a constant causes the largest reduction in binary decision diagram 138 sizes possible by setting a single variable to a constant. The method of the present invention may be extended to case-splitting upon multiple variables in one step by selecting variables in descending order of number of binary decision diagram 138 nodes for them, i.e., splitting using a binary decision diagram 138.

The overall symbolic simulation algorithm used by logic simulator 124 can be represented as the following pseudocode:

```
1. Function symbolic_simulate
2. Begin
3. cycle_num = 0;
4. while (cycle_num < (no. of cycles to be simulated) && (unsolved targets remaining)) do
5.   if(cycle_num == 0) { Build BDDs for the initial values and
Initialize the design by applying the initial value functions to the
registers}
6.   else    { Update state-vars by propagating BDD~ for the next-state
nodes to the state-vars}
7.   Create new BDD variables for each of the inputs for the current cycle
8.   Build BDDs for the constraints
9.   Build BDDs for the targets in the presence of constraints
10.  Constrain the target BDDs and check for targets hit
11.  Build BDDs for the next-functions in the presence of the constraints
12.  Cycle_num++
13. endwhile
14. endfunction.
```

Any of steps 5, 8, 9 and 11 of the overall symbolic simulation algorithm discussed above are subject to failure due to resource exhaustion, as described above. Therefore, logic simulator 124 performs steps 5, 8, 9 and 11 of the overall symbolic simulation method discussed above, such that, if a specified threshold is exceeded during binary decision diagram 138 construction, logic simulator 124 introduces a case-split. Such a threshold, such as the use of available memory, can be specified either by the user or automatically determined by logic simulator 124 based on whether the available allotment of resources.

The case-split restricts the values of the selected variable and/or node causing a drop (often a dramatic drop) in the number of live binary decision diagram nodes. Logic simulator 124 then continues the above-described algorithm until completion (i.e., the number of steps to be checked are completed or all targets 136 are solved) or until a binary decision diagram 138 again exceeds resources, in which case a next case-split is performed. The case-splits are stored on stack 140, and once all steps have been checked, logic simulator 124 may backtrack to the last case-split and apply the next value for the node/variable that the present invention case-split upon (the next value selection is described in more detail later). Logic simulator 124 continues this process until stack 140 becomes empty, increasing the likelihood of completeness of the entire process in that all possible values for all variables will have been considered. Note that the backtracking involves logic simulator 124 going back to a previous time-step and then continuing the temporal computation from there.

Note also that stack 140 dynamically grows and shrinks. For example, when logic simulator 124 backtracks to the first case-split and assigns to the case-split node or variable the next value (which was previously disallowed). Logic simulator 124 may apply another case-split while the current case for the first case-split is being computed. This new case-split is then entered on stack 140. Intuitively, case-split evaluations by logic simulator 124 can be visualized as a tree in which each node of the tree represents a case-split of a node at a certain cycle, and the children of the tree node represent evaluations of the design caused by setting the case-split node to the selected constant. The tree node corresponding to a case-split on a single variable will have two children, one each for the '0' and '1' values applied to that case-split node. A stack 140 entry consists of all live binary decision diagrams 138 just before the case-split. All live binary decision diagrams 138 are preserved in a snapshot at the time of the case-split in order to be able to recreate the state once the process backtracks to this case-split and processes the alternative branch.

While the present invention is described in the context of selecting a single variable to case-split upon at any given point in time, it is equally applicable and easily extended to the situation where multiple nodes may be selected to case-split upon at every step. Generally, in a tree-like representation or visualization of the case-splits, the number of children of any tree node should equal the total number of possible value assignments to the case-split nodes to ensure complete coverage.

The building function used by BDD builder 126 when constructing binary decision diagrams 138 in steps 5, 8, 9 and 11 (above) can be represented as pseudo-code as follows:

```
1. Function build_node_bdd(Edge edge)
2. Begin
3. Node node = source(edge);   //see the gate which sources
the edge
4. bool ivt = is_inverted(edge);   //see if the edge was
inverted
5. If(bdd_already_built(node)) bdd = get_node_bdd(node);   //
check if already built
6. else {
7.   BDD left = build_node_bdd(get_left_child(node));
8.   BDD right = build_node_bdd(get_right_child(node));
9.   bdd = bdd_and(left, right);
10.  if(not_valid(bdd)) {   //resources exceeded
        while(not_valid(bdd)) {
           case_split( );   // performs the case-split - also choses the
node(s)/variable(s) to split upon
           bdd = bdd_and(left, right);
        }
11 bdd = constrain_bdd(bdd);
12. }
13. return ivt? bdd_not(bdd): bdd;
14. endfunction
```

Within BDD builder 126, a case_split function 142 chooses the next variable(s) to split upon. It subsequently preserves all live binary decision diagrams 138 for use when backtracking to apply the other value of the case-split node(s), as explained above, and stores them on stack 140. Case_split function 142 also records the cycle number and the phase or stage of the symbolic simulation when the case-split occurred (such as "building target BDDs" or "building next-state function BDDs").

The selection of case split node variables is done by case_spit function 142 followed by splitting on the "fattest" variable(s). If the fastest variable is set to a constant, the largest number of nodes will be reduced to a constant. If there are multiple, equivalently fat variables, one of them is randomly chosen by case_split function 142. Further, in order to derive maximal benefit from setting the fattest variable, case_ split function 142 computes the number of active nodes that will exist as a result of setting it to a '0' as well as setting it to a '1'. The value that produces the maximum reduction is chosen as the value of the variable. Next, all alive binary decision diagrams 138 are recomputed with the chosen variable set to the chosen value, and the particular case-split is returned to the stack 140 of all cases.

As an optimization, logic simulator 124 can perform an 'inverse snapshot'. Instead of snapshotting all alive binary decision diagrams 138, logic simulator 124 may snapshot only binary decision diagrams 138 computed for the non-chosen value of the selected variable and store them on stack 140. With the inverse snapshot, these binary decision diagrams 138 computed for the non-chosen value are already available when picking out the value to set the variable to, as described above. Once logic simulator 124 backtracks to the case-split for which an inverse snapshot exists, the binary decision diagrams 138 for the other value of the variable are already available on stack 140 and available for use. For example, if logic simulator 124 chose to set a variable to a '1' logic simulator 124 snapshot the negative cofactors of all alive binary decision diagrams 138 on stack 140.

Logic simulator 124 can incorporate the above-discussed refinements through a modified cycle-based symbolic simulation algorithm with the case-splits as demonstrated in the following pseudocode:

```
1. Function symbolic_simulate
2. Begin
3. cycle_num = 0;
4. while (cycle_num <= (no. of cycles to be simulated) && (unsolved targets remaining) &&do
5. if(cycle_num = = 0) { Build BDDs for the initial states and Initialize the design in its initial state}
6. else           { Update state-vars by Propagating BDDs for the next-state nodes to the state-vars }
7. Create new BDD variables for each of the inputs for the current cycle
8. Build BDDs for the constraints
9. Build BDDs for the targets in the presence of constraints
10. Constrain target BDDs and check for targets hit
11. if(cycle_num = = (no. of cycles to be simulated)) {
12. if(cases remain, i.e. cases stack is not empty) {
13. cycle_num = cycle num of the last case-split
14. Restore BDDs for all nodes to their value for the other value of the case split node, and set the value of the node to the other value
15. Remove this case from the cases stack
16. Go to the phase (such as building target BDDs or next-state function BDDs) inwhich the case-split occurred
    }
   }
```

```
17. Build BDDs for the next-state functions in the presence of the constraints
18. cycle_num++
19. endwhile
20. end function
```

Using the method embodied in the pseudocode above, the case-splitting performed by case_split function 142 gracefully degrades into underapproximate analysis, if the ultimate ceiling on the resources is exhausted, by not completing the analysis for the values of the case-split variables that have not been attempted yet. Such a gracefully degrading process will be recognized by one skilled in the art to be similar to logic simulator 124 performing a wide breadth-first simulation of design netlist 120 with a large number of variables assuming symbolic valuations, and some variables (namely the case-split variables chosen by case_split function 142) being assigned constant values. Note that a variable here refers to a single copy of an input to the design in a certain cycle. The method used by case_split function 142 in the present invention does not imply that an input is fixed to a constant in every cycle. Hence, the method of the present invention performs a simulation of a very large number of test-vectors in parallel resulting in visiting a large number of states.

Figure 2:
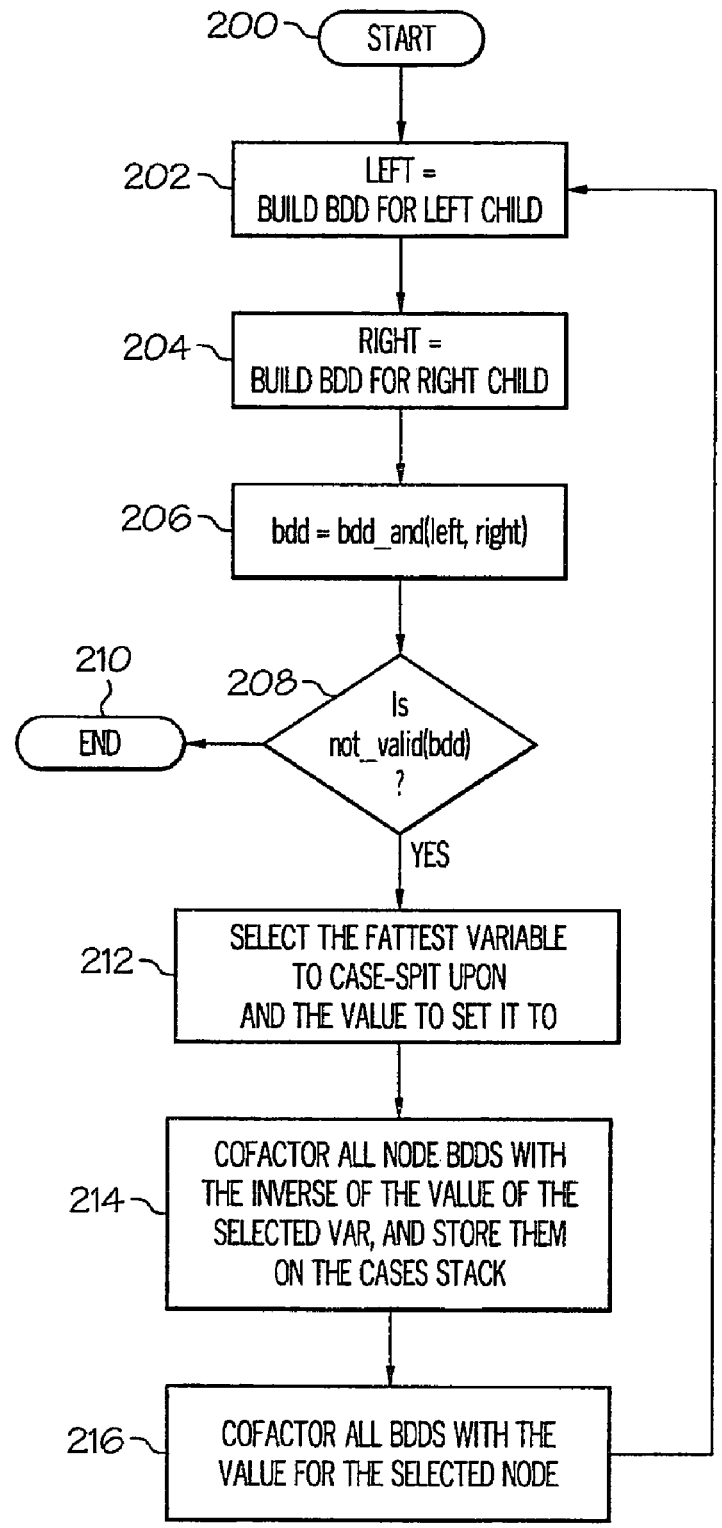
FIG. 2 is a flow diagram of a process for optimized automated for case-splitting on nodes in a symbolic simulation framework, in accordance with the preferred embodiment of the present invention.

Turning now to FIG. 2, a high level logical flowchart of a process for optimized automated case-splitting via constraints in a symbolic simulation framework is depicted. The process starts at step 200. The process then proceeds to steps 202 and 204, which respectively depict binary decision diagram builder 126 building a binary decision diagram 138 for a left child node and a right child node. The process next proceeds to step 206, which illustrates binary decision diagram builder 126 creating an aggregate binary decision diagram 138 composed of the combination of the binary decision diagram 138 for the left child node from step 202 and the binary decision diagram 138 for the right child node from step 204. The process next moves to step 208.

At step 208, logic simulator 124 determines whether the function not_valid(BDD) is active for the aggregate binary decision diagram 138 constructed in step 206. Not_valid (BDD) is a function that checks to determine if the construction of a binary decision diagram was impossible due to resource exhaustion. If logic simulator 124 determines that the function not_valid(BDD) is active for the aggregate binary decision diagram 138 created in step 206, then the process ends at step 210.

If, at step 208 logic simulator 124 determines that the function not_valid(BDD) is valid for the aggregate binary decision diagram 138 constructed in step 206, then the process next moves to step 212, which depicts logic simulator 124 selecting a fattest variable to case split on and a value to which to set that variable using a case_split function 142.

The process then moves to step 214. At step 214 logic simulator 124 cofactors and stores on the stack 140 all nodes 138 with the inverse of the value of the selected variable. The process then moves to step 216, which depicts logic simulator 124 cofactoring all other binary decision diagrams 138 with the resulting value for the binary decision diagram 138 of the selected node. The process then returns to step 202, which is described above.

Figure 3:
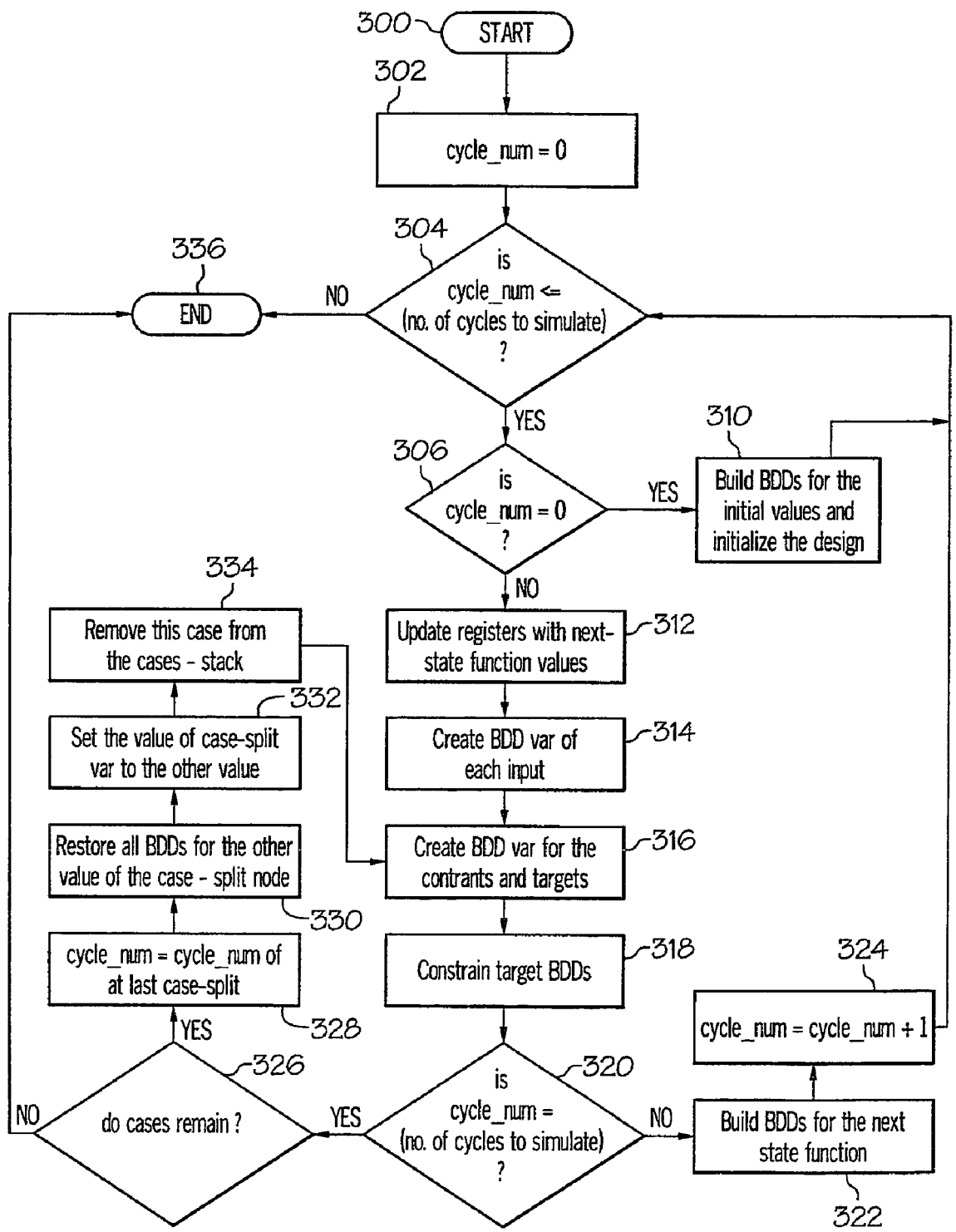
FIG. 3 is a high level logical flow chart of a process for performing symbolic simulation in a preferred embodiment of the present invention.

Turning now to FIG. 3, a high level logical flow chart of a process for performing symbolic simulation in a preferred embodiment of the present invention is depicted. The process described with respect to FIG. 2 will be employed, in a preferred embodiment, in conjunction with the process of FIG. 3 to provide a substantial optimization of the process of FIG. 3. The process starts at step 300. The process next moves to step 302, which depicts logical simulator 124 setting the variable cycle_num, which monitors time-steps, equal to zero. The process then proceeds to step 304. At step 304, logic simulator 124 determines whether cycle_num is less than or equal to the total number of cycles to simulate. If logic simulator 124 determines that cycle_num is not less than or equal to the total number of cycles to simulate, the process ends at step 336.

If logic simulator 124 determines that cycle_num is less than or equal to the number of cycles to simulate, then the process next moves to step 306, which depicts logic simulator 124 determining whether cycle_num is equal to zero. If cycle_ num is equal to zero, then the process then proceeds to step 310. At step 310, binary decision diagram builder 126 builds binary decision diagrams 138 for initial values and initializes the design contained in design netlist 120. The process then returns to step 304.

Returning to step 306, if logic simulator 124 determines that cycle_num does not equal zero, then the process next moves to step 312. At step 312 logic simulator 124 updates registers 150 with next state function values. The process then proceeds to step 314, which depicts logic simulator 124 creating a binary decision diagram 138 variable of each input. The process then proceeds to step 316. At step 316, binary decision diagram builder 126 builds binary decision diagrams 138 for constraints 134 and targets 136. The process then moves to step 318, which depicts binary decision diagram builder 126 constraining binary decision diagrams 138 representing targets 136. The process next moves to step 320.

At step 320, logic simulator 124 determines whether cycle_ num equals the total number of cycles to simulate. If cycle_ num does not equal the total number of cycles to simulate, then the process next moves to step 322. At step 322, binary decision diagram builder 126 builds binary decision diagrams 138 for the next state functions. The process then proceeds to step 324, which depicts logic simulator 124 incrementing cycle_num. The process then returns to step 304.

Returning to step 320, if logic simulator 124 determines that cycle_num is equal to the total number of cycles to simulate, then the process moves to step 326, which depicts logic simulator 124 determining if any cases remain. If logic simulator 124 determines that no cases remain, then the process ends at step 336. If logic simulator 124 determines that cases remain, then the process next moves to step 328. At step 328, logic simulator 124 sets cycle_num equal to the value of cycle_num at the most recent previous case-split. The process then moves to step 330.

At step 330 binary decision diagram builder 126 restores all binary decision diagrams 138 for a previous value of the case-split node. The process then moves to step 332, which depicts binary decision diagram builder 126 setting the value of the case-split node to the other value. The process then moves to step 334. At step 334 binary decision diagram builder 126 removes these cases from stack 140. The process then returns to step 316.

While the invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

What is claimed is:

1. A machine-readable recordable type storage medium having a plurality of instructions processable by a machine embodied therein, wherein said plurality of instructions, when processed by said machine, causes said machine to perform a method comprising:
   receiving a design;
   determining a number of simulation cycles necessary to simulate said design for verification;
   building for said design an intermediate binary decision diagram set containing one or more nodes representing one or more variables;
   in response to building said intermediate binary decision diagram set, initializing a plurality of registers associated with said design with initial values;
   creating a binary decision diagram variable for each input to said design;
   performing verification of said design by evaluating a property of said intermediate binary decision diagram;
   building for said design a subsequent intermediate binary decision diagram set containing one or more nodes representing one or more variables;
   updating said plurality of registers with a set of next state function values;
   case splitting upon a first fattest variable from among said one or more variables represented by said one or more nodes by setting said first fattest variable to a first value;
   first cofactoring said intermediate binary decision diagram set with respect to said one or more nodes using an inverse of said first value to generate a first cofactored binary decision diagram set;
   second cofactoring said intermediate binary decision diagram set with respect to said one or more nodes using said first value to generate a second cofactored binary decision diagram set;
   in response to determining at least one simulation cycle remains, repeating said building for said design said subsequent intermediate binary decision diagram set; and
   in response to determining that at least one simulation cycle does not remain, outputting results of said verification.

2. The machine-readable recordable type storage medium of claim 1, wherein said method further comprises performing verification of said design by evaluating a property of said first cofactored binary decision diagram set.

3. The machine-readable recordable type storage medium of claim 1, wherein said method further comprises storing said first cofactored binary decision diagram set on a stack.

4. The machine-readable recordable type storage medium of claim 1, wherein said method further comprises, in response to a size of said intermediate binary decision diagram set exceeding a size threshold, selecting for case-splitting said fattest variable from among said one or more variables represented by said one or more nodes.

5. The machine-readable recordable type storage medium of claim 4, wherein:
   selecting for case-splitting fattest variable from among said one or more variables represented by said one or more nodes further comprises selecting for case-splitting a set of multiple fattest variables from among said one or more variables represented by said one or more nodes; and said method further comprises repeating said first case-splitting, first cofactoring, and first performing steps on each of said set of multiple fattest variables from among said one or more variables represented by said one or more nodes.

6. The machine-readable recordable type storage medium of claim 1, wherein:

said step of first case-splitting upon a fattest variable from among said one or more variables represented by said one or more nodes by setting said fattest variable to a primary value further comprises first case-splitting upon a fattest from among said one or more variables represented by said one or more nodes by setting said fattest variable from among said one or more variables represented by said one or more nodes to a primary value at an identified time step.

7. The machine-readable storage medium of claim 1, wherein said method further comprises:

constraining a target binary decision diagram with at least one constraint.

* * * * *